United States Patent
Han et al.

(10) Patent No.: US 11,952,653 B2
(45) Date of Patent: Apr. 9, 2024

(54) SPUTTERING REACTION CHAMBER AND PROCESS ASSEMBLY OF SPUTTERING REACTION CHAMBER

(71) Applicant: BEIJING NAURA MICROELECTRONICS EQUIPMENT CO., LTD., Beijing (CN)

(72) Inventors: Liren Han, Beijing (CN); Bing Li, Beijing (CN); Keke Zhao, Beijing (CN); Lixin Pei, Beijing (CN); Guodong Bian, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 17/794,902

(22) PCT Filed: Jan. 13, 2021

(86) PCT No.: PCT/CN2021/071461
§ 371 (c)(1),
(2) Date: Jul. 22, 2022

(87) PCT Pub. No.: WO2021/147724
PCT Pub. Date: Jul. 29, 2021

(65) Prior Publication Data
US 2023/0055006 A1    Feb. 23, 2023

(30) Foreign Application Priority Data

Jan. 22, 2020   (CN) .......................... 202010073789.9

(51) Int. Cl.
*C23C 14/04*    (2006.01)
*C23C 14/34*    (2006.01)
(Continued)

(52) U.S. Cl.
CPC ............ *C23C 14/042* (2013.01); *C23C 14/34* (2013.01); *C23C 14/50* (2013.01); *C23C 14/541* (2013.01)

(58) Field of Classification Search
None
See application file for complete search history.

(56) References Cited

U.S. PATENT DOCUMENTS

| 2014/0256129 | A1 | 9/2014 | Pao-Tsung et al. |
| 2017/0002461 | A1* | 1/2017 | Johanson ............... C23C 14/564 |
| 2017/0011892 | A1* | 1/2017 | Guo .................. H01L 21/68735 |

FOREIGN PATENT DOCUMENTS

| CN | 201301338 Y | 9/2009 |
| CN | 102007572 A | 4/2011 |

(Continued)

OTHER PUBLICATIONS

English translation of CN110670042A.*
(Continued)

*Primary Examiner* — Charles Capozzi
(74) *Attorney, Agent, or Firm* — ANOVA LAW GROUP, PLLC (57) ABSTRACT

The present disclosure provides a sputtering reaction chamber and a process assembly of the sputtering reaction chamber. The process assembly includes a liner, and the liner includes an integrally formed body member and a cover member. The cover member may extend from a bottom of the body member to an inner side of the body member and may be configured to press an edge of a to-be-processed workpiece when a process is performed. A cooling channel may be arranged in the cover member and the body member and may be configured to cool the cover member and the body member by transferring coolant. The process assembly of the sputtering reaction chamber and the sputtering reaction chamber provided by the present disclosure can reduce (Continued)

heat radiation of the process assembly to the to-be-processed workpiece and released gases and impurities to effectively reduce a whisker defect and improve a product yield.

9 Claims, 4 Drawing Sheets

(51) Int. Cl.
    C23C 14/50    (2006.01)
    C23C 14/54    (2006.01)

(56)           References Cited

FOREIGN PATENT DOCUMENTS

| CN | 102465260 A | 5/2012 |
| CN | 102007572 B | 1/2013 |
| CN | 107949654 A | 4/2018 |
| CN | 207391539 U | 5/2018 |
| CN | 110468377 A | 11/2019 |
| CN | 110670042 A | 1/2020 |
| CN | 111235535 A | 6/2020 |
| JP | H06322528 A | 11/1994 |
| KR | 101571558 B1 | 11/2015 |
| KR | 20180033570 A | 4/2018 |
| TW | 201708588 A | 3/2017 |

OTHER PUBLICATIONS

The World Intellectual Property Organization (WIPO) International Search Report for PCT/CN2021/071461 dated Apr. 19, 2021 9 Pages (including translation).

* cited by examiner

SPUTTERING REACTION CHAMBER AND PROCESS ASSEMBLY OF SPUTTERING REACTION CHAMBER

CROSS-REFERENCE TO RELATED APPLICATIONS

This application is a national phase entry under 35 U.S.C. § 371 of International Application No. PCT/CN2021/071461, filed on Jan. 13, 2021, which claims priority to Chinese Application No. 202010073789.9 filed Jan. 22, 2020, the entire contents of all of which are incorporated herein by reference.

TECHNICAL FIELD

The present disclosure generally relates to the semiconductor manufacturing technical field and, more particularly, to a sputtering reaction chamber and a process assembly of the sputtering reaction chamber.

BACKGROUND

An aluminum thin film is commonly used as an aluminum pad (Al Pad) in various electronic devices of an integrated circuit, which is formed at an upper end of a metal interconnect layer. The aluminum pad is generally prepared by a physical vapor deposition (PVD) method. A typical aluminum pad preparation process may include feeding a wafer into a Degas chamber to perform heating to remove water absorbed by a surface of the wafer, and then feeding the wafer into a pre-clean chamber to perform pre-cleaning on the surface of the wafer, and then feeding the pre-clean wafer to a process chamber to form a tantalum nitride film on the surface of the wafer, and finally depositing a layer of an aluminum thin film on the tantalum nitride film. Generally, during sputtering, as argon ions (Ar+) in a plasma continuously bombard the target, a large amount of heat may be generated in the process chamber, which causes a rapid temperature rise in the process chamber and members in the process chamber, such as the target, a shield, a wafer, and a shutter disk. If heat dissipation efficiency of these members is not high enough, the temperature of these members may get higher and higher as sputtering time increases. More gases or impurities may be released in the chamber, which causes the wafer to be contaminated, and a temperature fluctuation generated by these members may also cause excessive stress on the wafer during a growth process. The wafer with excessive stress or contaminated by the impurities may generate an aluminum columnar protrusion defect along a die edge, i.e., whisker defect, thus, affecting a product yield. Therefore, controlling the temperature of the aluminum thin film during the deposition process is an important manner and measure for controlling the generation of the whisker defect.

In existing technology, the temperature of the shield may be controlled by applying a method of introducing cooling water into the shield of the process chamber. Thus, a negative effect on the wafer production generated due to the excessive temperature of the shield may be avoided. However, since the temperature of the cover ring, which is close to the wafer, rises quickly during a continuous sputtering process, the cover ring may directly perform heat radiation on the wafer. At the same time, the gases and impurities may be released, which may cause the wafer to generate the whisker defect and finally affect the product yield.

SUMMARY

In order to solve the at least one problem mentioned above, a sputtering reaction chamber and a process assembly of the sputtering reaction chamber provided by the present disclosure may reduce the heat radiation of the process assembly on a to-be-processed workpiece and released gases and impurities to effectively reduce whisker defects and improve product yield.

According to an aspect of embodiments of the present disclosure, a process assembly of a sputtering reaction chamber is provided, including a shield, the shield including a body member and a cover ring member integrally formed, wherein the body member is in a ring shape. The cover ring member extends from a bottom of the body member to an inner side of the body member and is configured to press an edge of the to-be-processed workpiece when a process is performed. A cooling channel is arranged in the cover ring member and the body member and configured to cool the cover ring member and the body member by transferring coolant.

In some embodiments, the cooling channel includes a first channel located in the body member and a second channel located in the cover ring member, and the first channel is communicated with the second channel.

In some embodiments, the first channel and the second channel are in a ring shape, wherein the first channel is circumferentially arranged along a circumferential direction of the body member, a circumferential outer end of the second channel is communicated with a lower end of the first channel, and a circumferential inner end of the second channel is located at a position close to a circumferential inner end of the cover ring member.

In some embodiments, the cooling channel further includes an inlet channel and an outlet channel. The inlet channel and the outlet channel are both arranged in the body member. One end of each of the inlet channel and the outlet channel are communicated with the first channel. Another end of each of the inlet channel and the outlet channel are configured to be connected to an outlet end pipeline and an inlet end pipeline of a coolant source.

In some embodiments, the cooling channel includes a first channel located in the body member and a second channel located in the cover ring member, and the first channel and the second channel are independent from each other.

In some embodiments, the cooling channel further includes a first inlet channel, a first outlet channel, a second inlet channel, and a second outlet channel. The first inlet channel and the first outlet channel are both arranged in the body member. One end of each of the first inlet channel and the first outlet channel is communicated with the first channel. Another end of each of the first inlet channel and the first outlet channel is configured to be connected to an outlet end pipeline and an inlet end pipeline of a coolant source, respectively. The second inlet channel and the second outlet channel are both arranged in the cover ring member. One end of each of the second inlet channel and the second outlet channel is communicated with the second channel. Another end of each of the second inlet channel and the second outlet channel is configured to be connected to the outlet end pipeline and the inlet end pipeline of the coolant source. A diameter of the second inlet channel and a diameter of the second outlet channel are smaller than a diameter of the first inlet channel and a diameter of the first outlet channel.

In some embodiments, the process assembly further includes a deposition ring configured to support the to-beprocessed workpiece at a bottom edge of the to-be-processed workpiece. The cover ring member and the deposition ring include a first surface and a second surface opposite to each other, respectively. The first surface and the second surface are two concave-convex surfaces that cooperate with each other to form a labyrinth channel between the two concave-convex surfaces.

In some embodiments, the deposition ring includes a deposition member and a first matching member. The deposition member is arranged around the bottom edge of the to-be-processed workpiece and configured to support the to-be-processed workpiece. An inner circumferential end of the first matching member is integrally formed with an outer circumferential end of the deposition member. An outer circumferential end of the first matching member is bent and extends to an outer side of the deposition member to sequentially form a first concave member and a first convex member that are recessed and convex relative to an upper surface of the deposition member, respectively. A second convex member and a second concave member are formed at a bottom of the cover ring member corresponding to the first concave member and the first convex member to form the labyrinth channel.

According to another aspect of embodiments of the present disclosure, a sputtering reaction chamber is provided, including a chamber body and a base arranged in the chamber body, and further including the process assembly of the sputtering reaction chamber provided by embodiments of the present disclosure, wherein the body member is arranged around the inner side of the sidewall of the chamber body, and the cover ring member is configured to press the edge of the to-be-processed workpiece during the process.

In some embodiments, the process assembly further includes a deposition ring arranged around the base and located at a position corresponding to a bottom edge of the to-be-processed workpiece placed on the base and configured to support the to-be-processed workpiece. The deposition ring and the cover ring member include a first surface and a second surface opposite to each other, respectively. The first surface and the second surface are the two concave-convex surfaces that cooperate with each other to form the labyrinth channel between the two concave-convex surfaces.

The process assembly of the sputtering reaction chamber provided by embodiments of the present disclosure, by omitting the cover ring independently arranged in the existing technology, improving the shield in the process assembly, that is, the shield includes the cover ring member and the body member that are integrally formed, and arranging the cooling channel in the cover ring member and the body member, may cool the cover ring member and the body member simultaneously based on the process assembly having the same function as the cover ring and shield in the existing technology, which improves the cooling efficiency and eliminates the heat source generated when the cover ring exists independently. Thus, the heat radiation of the process assembly to the to-be-processed workpiece may be reduced, and the released gases and the impurities may be reduced during the process, thereby reducing the whisker defects and improving the product yield. In addition, the process assembly provided by embodiments of the present disclosure may have a simple structure and high cooling efficiency, may be conveniently disassembled and assembled, and may guarantee a good process environment.

The sputtering reaction chamber provided by embodiments of the present disclosure, by adopting the process assembly provided by embodiments of the present disclosure, may reduce the heat radiation of the process assembly to the to-be-processed workpiece and the released gases and impurities to effectively reduce the whisker defects, improve the product yield, and meanwhile, guarantee the good process environment.

BRIEF DESCRIPTION OF THE DRAWINGS

In order to more clearly illustrate embodiments of the present disclosure or the technical solutions in the existing technology, the drawings required in the embodiments or the existing technology are briefly described below. Apparently, the drawings in the following description are merely exemplary, and those of ordinary skill in the art may further obtain other embodiments according to the provided drawings without creative efforts.

The structures, proportions, and sizes shown in the present specification are only used in connection with the content disclosed in the specification to be understood and read by those skilled in the art and are not a limitation to limit the implementation of the present disclosure, and therefore, do not have actual meaning in the technology. Modifications of any structure, changes of the proportional relationship, or adjustments in the size should still be within the scope of the technical content disclosed in the present disclosure without affecting the effects and purposes that can be achieved by the present disclosure.

REFERENCE NUMERALS

1 Deposition ring, 11 First matching member, 111 First concave member, 112 First convex member, 12 Deposition member, 2 Shield, 21 Body member, 22 Cover ring member, 221 Second concave member, 222 Second convex member, 3 Adapter, 31 Through-hole, 4 Ceramic ring, 5 Base, 6 Target, 7 Cooling channel, 71 First channel, 72 Second channel, 72a Circumferential outer end of second channel 72, 72b Circumferential inner end of second channel 72, 73a Inlet channel, 73b Outlet channel, 8 Support base, 9 Channel connector, 10 Chamber body, A First surface, B Second surface, and C Labyrinth channel

DETAILED DESCRIPTION OF THE EMBODIMENTS

A specific application of embodiments of the present disclosure includes a preparation process of an aluminum pad (Al-Pad). An aluminum thin film is commonly used as an aluminum pad in various electronic devices of an integrated circuit, which is formed at an upper end of a metal interconnect layer. The aluminum pad is generally prepared by a physical vapor deposition (PVD) method. A typical aluminum pad preparation process may include feeding a wafer into a Degas chamber to perform heating to remove water absorbed by a surface of the wafer, and then feeding the wafer into a pre-clean chamber to perform pre-cleaning on the surface of the wafer, and then feeding the pre-clean wafer to a process chamber to form a tantalum nitride film on the surface of the wafer, and finally depositing a layer of an aluminum thin film on the tantalum nitride film. Generally, during sputtering, as argon ions (Ar+) in a plasma continuously bombard the target, a large amount of heat may be generated in the process chamber, which causes a rapid temperature rise in the process chamber and members in the process chamber, such as the target, a shield, a wafer, and a shutter disk. If heat dissipation efficiency of these members is not high enough, the temperature of these members may get higher and higher as sputtering time increases. More gases or impurities may be released in the chamber, which causes the wafer to be contaminated, and a temperature fluctuation generated by these members may also cause excessive stress on the wafer during a growth process. The wafer with excessive stress or contaminated by the impurities may generate an aluminum columnar protrusion defect along a die edge, i.e., whisker defect, thus, affecting a product yield. Therefore, controlling the temperature of the aluminum thin film during the deposition process is an important manner and measure for controlling the generation of the whisker defect.

In order to effectively control a process temperature, suppress the generation of the whisker defect during the deposition of the aluminum thin film, and improve the product yield, embodiments of the present disclosure provide a sputtering reaction chamber and a process assembly of the sputtering reaction chamber.

Embodiments of the present disclosure are described by specific embodiments below. Those skilled in the art may easily understand other advantages and effects of the present disclosure from the content disclosed by the present specification. Apparently, the described embodiments are some embodiments of the present disclosure, rather than all embodiments. Based on embodiments of the present disclosure, all other embodiments obtained by those of ordinary skill in the art without creative efforts shall be within the scope of the present disclosure.

In the description of the present disclosure, it should be noted that orientations or position relationships that are indicated by the terms "center," "upper," "lower," "left," "right," "vertical," "horizontal," "inner," and "outer" are orientations or position relationship shown in the accompanying drawings, which are merely intended to describe the present disclosure and the simplify the description, rather than indicating or implying that an indicated device or element has to have a particular orientation or is constructed and operated in a particular orientation. Therefore, the terms cannot be construed as a limitation of the present disclosure. In addition, the terms "first," "second," and "third" are merely used for a descriptive purpose and cannot be construed as indicating or implying relative importance.

In the description of the present disclosure, it should be noted that the terms "mounted," "connected," and "coupled" should be understood broadly, for example, may be fixedly connected, detachably connected, or integrally connected, may be mechanically connected or electrically connected, or may be directly connected, indirectly connected through an intermediate medium, or an internal communication of the two elements. For those of ordinary skill in the art, specific meanings of the above terms in the present disclosure may be understood according to specific situations. When there is no conflict, embodiments and features of the embodiments of the present disclosure may be combined with each other. In order to make the above purposes, features, and advantages of the present disclosure more apparent and comprehensible, specific embodiments of the present disclosure are described in detail below in connection with the accompanying drawings.

According to an aspect of embodiments of the present disclosure, a process assembly of a sputtering reaction chamber is provided. For example, the process assembly is applied to the sputtering reaction chamber shown in FIG. 1. The sputtering reaction chamber includes a chamber body 10 and a base 5 arranged in the chamber body 10. The base 5 may be configured to carry a to-be-processed workpiece (e.g., a wafer).

Figure 1:
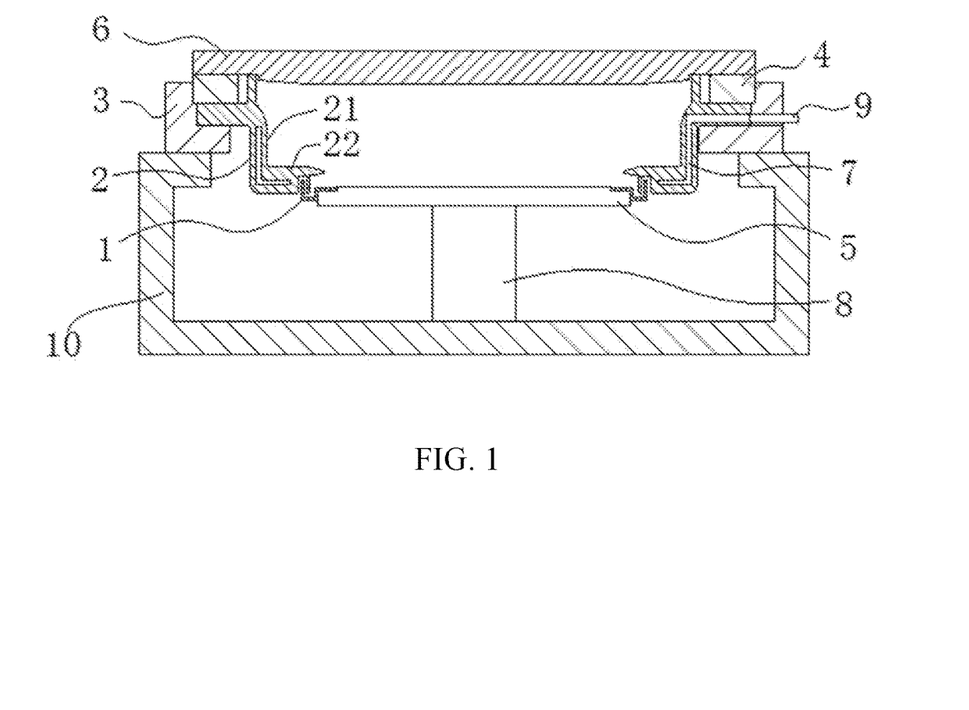
FIG. 1 is a schematic cross-sectional diagram of a sputtering reaction chamber according to some embodiments of the present disclosure.

The process assembly is arranged in the chamber body 10 and includes a shield 2. Specifically, as shown in FIG. 1, the shield 2 that is integrally formed includes a body member 21 and a cover ring member 22, wherein the body member 21 may be in a ring shape and may be configured to surround an inner side of the chamber body 10 to protect an inner sidewall of the chamber body 10 from being sputtered. The cover ring member 22 extends from a bottom of the body member 21 to an inner side of the body member 21, that is, forms an "inner flange" structure at the bottom of the body member 21, and may be configured to press an edge of the to-be-processed workpiece (e.g., press an edge region of an upper surface of the wafer) when the process is performed, so as to fix the processed workpiece. Moreover, as shown in FIG. 1, a cooling channel 7 is arranged in the cover ring member 22 and the body member 21 and configured to cool the cover ring member 22 and the body member 21 by transferring coolant. The coolant may be, for example, cooling water.

In the inner shield 2, by using the integrally formed cover ring member 22 and the body member 21 and arranging the cooling channel 7 in the cover ring member 22 and the body member 21, an independent cover ring may not need not be provided, and since the cover ring member 22 and the body member 21 are integrally formed, the cooling channel 7 can simultaneously cool the cover ring member 22 and the body member 21, which improves the cooling efficiency and eliminates a heat source formed when the independent cover ring is provided. Thus, heat radiation of the process assembly on the to-be-processed workpiece may be reduced to release gases and impurities during the process. Thus, the whisker defect may be reduced, and the product yield may be improved. In addition, the process assembly of embodiments of the present disclosure may have a simple structure and high cooling efficiency, be convenient to be disassembled and assembled, and also well ensure a process environment.

Figure 2:
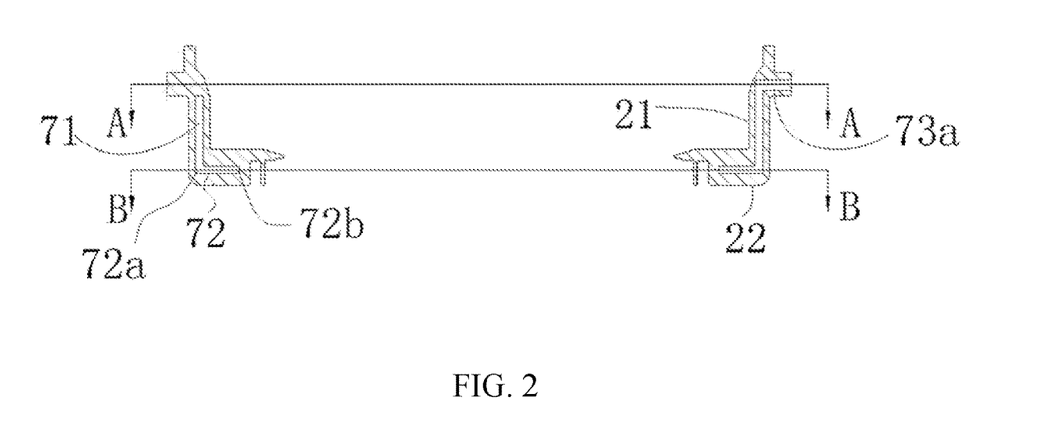
FIG. 2 is a schematic cross-sectional diagram of a process assembly according to some embodiments of the present disclosure.

In some embodiments, as shown in FIG. 2, the cooling channel 7 includes a first channel 71 located in the body member 21 and a second channel 72 located in the cover ring member 22. The first channel 71 is communicated with the second channel 72. Of course, in practical applications, the first channel 71 and the second channel 72 may also be independent of each other. In this case, the body member 21 and the cover ring member 22 may be cooled, respectively, by introducing coolant to the body member 21 and the cover ring member 22, respectively. Thus, parameters such as flow and temperature of the coolant flowing through the body member 21 and the cover ring member 22 may be adjusted, respectively, to achieve precise control of the temperature.

In some embodiments, the first channel 71 and the second channel 72 may have a plurality of structures. For example, as shown in FIG. 2, the first channel 71 and the second channel 72 are both in a ring shape. The first channel 71 surrounds a circumferential direction of the body member 21. A circumferential outer end 72a of the second channel 72 is communicated with a lower end of the first channel 71. A circumferential inner end 72b of the second channel 72 is located at a position close to a circumferential inner end of the cover ring member 22. The first channel 71 and the second channel 72 may be configured to cool the body member 21 and the cover ring member 22, respectively. Moreover, since the circumferential inner end 72b of the second channel 72 is located at a position close to the circumferential inner end of the cover ring member 22, the second channel 72 may be caused to be close to the circumferential inner end of the cover ring member 22 as close as possible. Thus, heat exchange efficiency of a portion of the cover ring member 22 near the inner end of the cover ring member 22 may be improved to control the temperature of the portion to be within a lower range. Thus, the heat radiation to the to-be-processed workpiece and the gases and impurities released during the process may be further reduced. In addition, the cover ring portion 22 having a lower temperature may also have heat exchange with a relatively close assembly (e.g., a deposition ring 1) to reduce the temperature of the assembly. Thus, the heat radiation of the assembly near the cover ring member 22 to the to-be-processed workpiece and the gas and impurities released during the process may be reduced.

Figure 3:
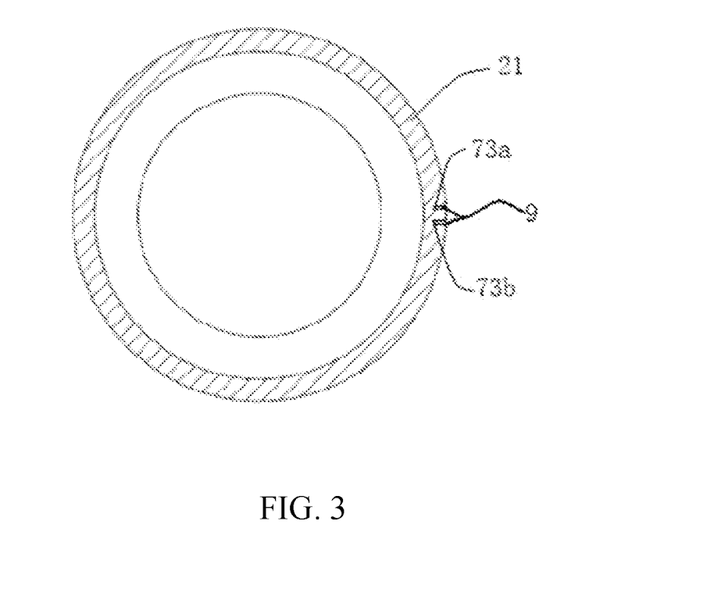
FIG. 3 is a schematic cross-sectional diagram along line A-A of FIG. 2.

In some embodiments, as shown in FIG. 2 and FIG. 3, the cooling channel 7 further includes an inlet channel 73a and an outlet channel 73b. The inlet channel 73a and the outlet channel 73b are both arranged in the body member 21. One end of each of the inlet channel 73a and the outlet channel 73b is communicated with the first channel 71. The other ends of the inlet channel 73a and the outlet channel 73b are connected to an outlet end pipeline and an inlet end pipeline (not shown) of a coolant source, respectively. Thus, a circulated flow of the coolant may be realized. Of course, in practical applications, the inlet channel 73a and the outlet channel 73b may also be arranged in the cover ring member 22, and one end of each of the inlet channel 73a and the outlet channel 73b is communicated with the second channel 72, or, a pair of inlet channels 73a and outlet channels 73b may be provided in both of the body member 21 and the cover ring member 22 to simultaneously circulate the coolant into the first channel 71 and the second channel 72.

In some embodiments, the inlet channel 73a and the outlet channel 73b are located at a position close to an upper end of the body member 21. Thus, the coolant may flow from top to bottom, that is, through the body member 21 first and then through the cover ring member 22. Thus a problem of an excessive temperature difference generated when the coolant is first introduced into the inner circumferential end member of the cover ring member 22 may be avoided, and the heat exchanged efficiency may be improved simultaneously.

Specifically, in embodiments of the present disclosure, as shown in FIG. 3, the first channel 71 is in a non-closed ring shape. In this case, the inlet channel 73a and the outlet channel 73b may be arranged side by side, and are communicated with the first channel 71 at two opening ends of the first channel 71, respectively. It is easy to understand that the two opening ends of the first channel 71 may be isolated from each other. As such, the coolant may enter the first channel 71 via the inlet channel 73a, flow from a corresponding opening end of the first channel 71 to the other opening end, and then flow out via the outlet channel 73. The second channel 72 may be a closed ring-shaped channel, or may be the same as the first channel 71 described above in the non-closed ring shape. The position of the opening end of the second channel 72 may correspond to the position of the opening end of the first channel 71. The coolant that enters the first channel 71 via the inlet channel 73a may flow downward into the second channel 72. Of course, in practical applications, the first channel 71 and the second channel 72 may also adopt any other structures, for example, a closed ring shape. In this case, the inlet channel 73a and the outlet channel 73b may be symmetrically arranged on both sides of the first channel 71. Thus, the coolant that enters the first channel 71 via the inlet channel 73a may be divided and flow through two semicircular portions of the first channel 71. After converging at the outlet channel 73b, the coolant may flow out via the outlet channel 73b.

In some embodiments, as shown in FIG. 3, the process assembly further includes two channel connectors 9 (i.e., a water inlet connector and a water outlet connector). The two channel connectors 9 are arranged at one end of the inlet channel 73a and one end of the outlet channel 73b, respectively, and configured to be connected to the outlet end pipeline and the inlet end pipeline (not shown) of the coolant source, respectively. The channel connectors 9 may achieve a quick connection with the pipelines.

It should be noted that if the first channel 71 and the second channel 72 are independent of each other, the cooling channel may further include a first inlet channel, a first outlet channel, a second inlet channel, and a second outlet channel, wherein the structure and function of the first inlet channel and the first outlet channel may be same as the structure and function of the inlet channel 73a and the outlet channel 73b above. The second inlet channel and the second outlet channel may be both arranged in the cover ring member 22, and an end of the second inlet channel and an end of the second outlet channel may be communicated with the second channel 72. The other end of the second inlet channel and the other end of the second outlet channel may be configured to be connected to the outlet end pipeline and the inlet end pipeline of the coolant source, respectively. As such, the coolant provided by the coolant source may flow into the second channel 72 separately via the second inlet channel and the second outlet channel described above. Moreover, diameters of the second inlet channel and the second outlet channel may be smaller than diameters of the first inlet channel and the first outlet channel. In this way, the flow of the coolant flowing into the second channel 72 may be smaller than the flow of the coolant flowing into the first channel 71. Thus, the temperature of the body member 21 and the cover ring member 22 may be differentially adjusted to achieve the precise temperature control.

Figure 4A:
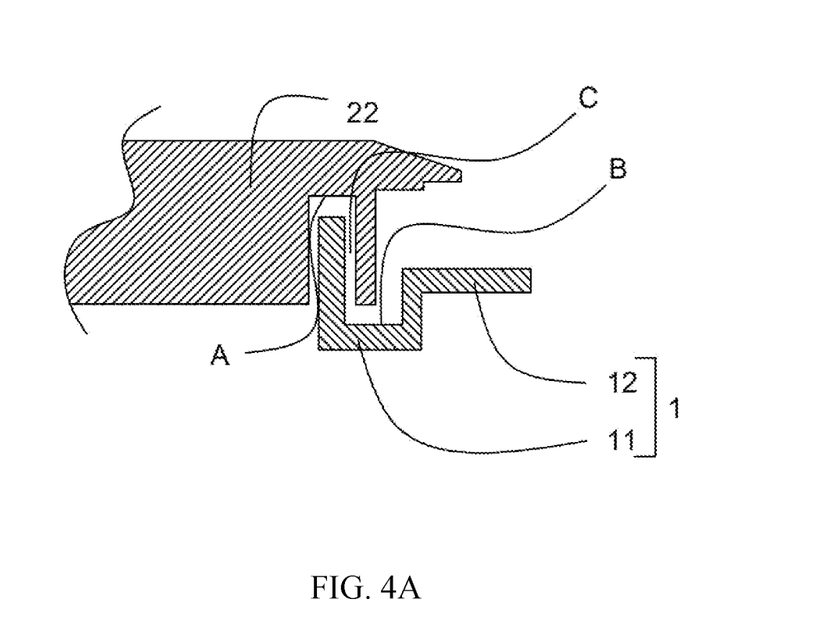
FIG. 4A is a schematic cross-sectional diagram showing a portion of a cover ring member and a portion of a deposition ring according to some embodiments of the present disclosure.

In some embodiments, as shown in FIG. 2, the process assembly further includes a deposition ring 1. The deposition ring 1 is arranged on the base 5 and may be configured to support the to-be-processed workpiece at a bottom edge of the to-be-processed workpiece. In addition, as shown in FIG. 4A, the cover ring member 22 and the deposition ring 1 include a first surface A and a second surface B opposite to each other, respectively. The first surface A and the second surface B are two concave-convex surfaces that cooperate with each other to form a labyrinth channel C between the two concave-convex surfaces. The labyrinth channel C can not only prevent the plasma from entering a position under the base 5 while ensuring that the gas flows to the bottom of the chamber body 10, but also increase a surface area where the deposition ring 1 and the cover ring member 22 are opposite to each other. Thus, the heat transfer efficiency between the deposition ring 1 and the cover ring member 22 may be improved to improve the cooling effect to the deposition ring 1. As such, the heat radiation of the process assembly to the to-be-processed workpiece and the gases and the impurities released during the processing process may be further reduced.

Figure 4B:
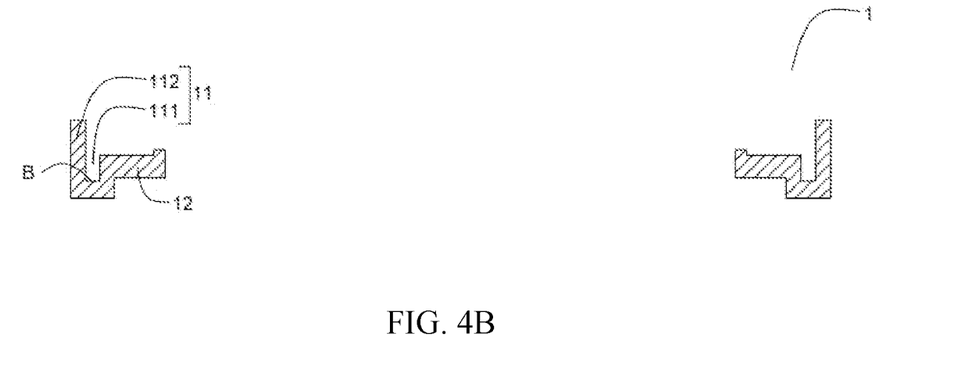
FIG. 4B is a schematic cross-sectional diagram of a deposition ring according to some embodiments of the present disclosure.
Figure 4C:
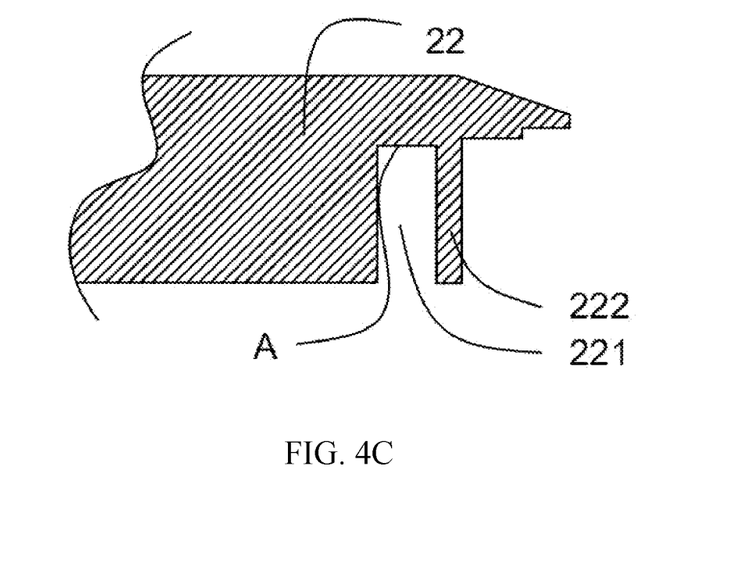
FIG. 4C is a schematic cross-sectional diagram showing a portion of a cover ring member according to some embodiments of the present disclosure.
Figure 4D:
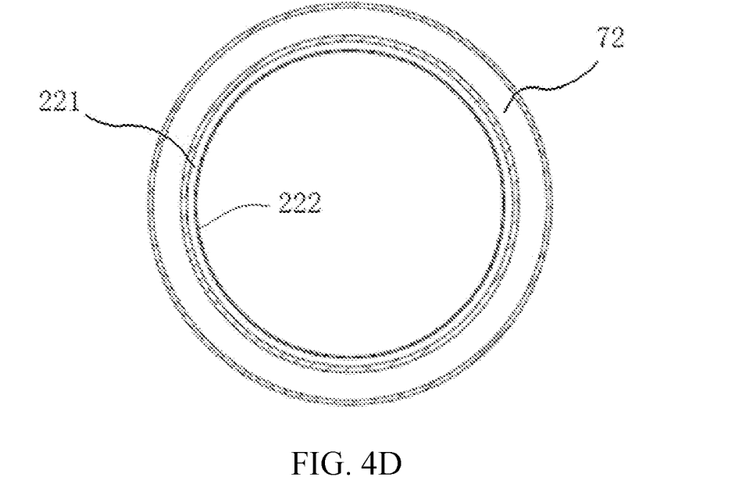
FIG. 4D is a schematic top view showing a cross-section structure along line B-B of FIG. 2.

The first surface A and the second surface B may have a plurality of structures. For example, as shown in FIG. 4B, the deposition ring 1 includes a deposition member 12 and a first matching member 11, wherein the deposition member 12 is arranged surrounding at a bottom edge of the to-be-processed workpiece and is configured to support the to-be-processed workpiece. An inner circumferential end of the first matching member 11 may be integrally formed with an outer circumferential end of the deposition member 12. An outer circumferential end of the first matching member 11 is bent and extends toward an outer side of the deposition member 12 to sequentially form a first concave member 111 and a first convex member 112 recessed and protruded relative to an upper surface of the deposition member 12. Surfaces of the first concave member 111 and the first convex member 112 may be concave-convex surfaces, that is, forming the second surface B. Corresponding to the first concave member 111 and the first convex member 112, as shown in FIG. 4C and FIG. 4D, a second convex member 222 and a second concave member 221 are formed at the bottom of the cover ring member 22. Both the second convex member 222 and the second concave member 221 are in a ring shape, and surfaces of the second convex member 222 and the second concave member 221 are the concave-convex surfaces, that is, forming the first surface A, wherein the second convex member 222 and the second concave member 221 may be nested with the first concave member 111 and the first convex member 112 to form the labyrinth channel C.

It should be noted that the process assembly provided by embodiments of the present disclosure is not limited to an application in a PVD apparatus, or may be applied in another semiconductor manufacturing apparatus.

According to another aspect of embodiments of the present disclosure, a sputtering reaction chamber is provided. A structure of the sputtering reaction chamber is shown in FIG. 1, includes a chamber body 10 and a base 5 arranged in the chamber body 10, and further includes the above process assembly of the sputtering reaction chamber, wherein the process assembly includes a shield 2. The shield 2 includes a body member 21 and a cover ring member 22. The body member 21 is arranged surrounding an inner side of a sidewall of the chamber body 10 and is configured to protect the inner sidewall of the chamber body 10 from being sputtered. The cover ring member 22 is configured to press the edge of the to-be-processed workpiece during the process to fix the to-be-processed workpiece on the base 5.

Figure 5:
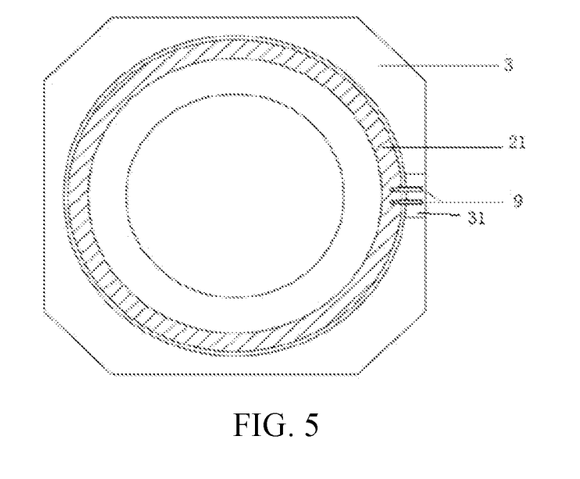
FIG. 5 is a schematic cross-sectional diagram showing the sputtering reaction chamber at a channel connector according to some embodiments of the present disclosure.

Specifically, in the embodiment, the sputtering reaction chamber includes a deposition ring 1, the shield 2, an adapter 3, a ceramic ring 4, the base 5, a target 6, a cooling channel 7, a support base 8, and a channel connector 9, wherein the adapter 3 surrounds the top of the sidewall of the chamber body 10, and the shield 2 is mounted at the adapter 3. Moreover, in some embodiments, a through-hole 31 is arranged in the adapter 3 and is configured to accommodate the channel connector 9 and cause the outlet end pipeline and the inlet end pipeline of the coolant source to be connected to two channel connectors 9 from an outer side via the through-hole 31.

The ceramic ring 4 is mounted between the target 6 and the shield 2 and is configured to support the target 6. The deposition ring 1, the shield 2, the base 5, and the support base 8 are located in the chamber body 10. The base 5 is supported by the support base 8. The deposition ring 1 is mounted at the base 5, and is located at a position corresponding to the bottom edge of the to-be-processed workpiece placed on the base 5 to support the to-be-processed workpiece. The cooling channels 7 are arranged in the body member 21 and the cover ring member 22 and communicated with the two channel connectors 9 through the inlet channel 73a and the outlet channel 73b, respectively.

The sputtering reaction chamber provided by embodiments of the disclosure, by adopting the process assembly provided by embodiments of the disclosure, may reduce the heat radiation of the process assembly to the to-be-processed workpiece and the released gases and impurities to effectively reduce the whisker defect, increased the product yield, and meanwhile, guarantee a good process environment.

Although the present disclosure has been described in detail with the general description and specific embodiments, some modifications or improvements may be made to the present disclosure based on the present disclosure, which is apparent to those skilled in the art. Therefore, these modifications or improvements made without departing from the spirit of the disclosure shall fall within the scope of the present disclosure.

What is claimed is:

1. A process assembly of a sputtering reaction chamber comprising:
  a liner including:
    a body member being in a ring shape; and
    a cover member integrally formed with the body member, extending from a bottom of the body member along a radial direction of the body member, and configured to fix a to-be-processed workpiece placed over a base when a process is performed, wherein:
      a cooling channel is arranged in the cover member and the body member and includes a first cooling channel in the body member and a second cooling channel in the cover member, the first cooling channel communicating with the second cooling channel;
  a deposition ring, wherein the cover member and the deposition ring cooperate with each other to form a labyrinth channel,
  the deposition ring including:
    a deposition member arranged radially with a bottom surface on top of the base and configured to contact with and support an outer edge of the to-be-processed workpiece,
    a deposition-ring convex member arranged axially, and
    a deposition-ring concave groove between the deposition-ring convex member and the deposition member;

wherein
the cover member includes a cover-member concave member in a ring shape corresponding to, and cooperating with, the deposition-ring convex member, and
the cover member further includes a cover-member convex member with an inner ring sidewall inserted into the deposition-ring concave groove to form the labyrinth channel.

2. The process assembly according to claim 1, wherein:
the first channel is in a ring shape and is circumferentially arranged along a circumferential direction of the body member; and
the second channel extends from a bottom of the first channel to an end of the cover member along the radial direction of the cover member.

3. The process assembly according to claim 1, further comprising:
a channel connector located at a top of the body member;
wherein the cooling channel further includes:
a third channel connected to the channel connector and communicating with the first channel to circulate in real-time to change a coolant during cooling.

4. The process assembly according to claim 3, further comprising:
an adapter including a through-hole corresponding to the channel connector, the liner being mounted at the adapter.

5. A sputtering reaction chamber comprising:
a chamber body;
a base arranged in the chamber body; and
a process assembly including:
a liner including:
a body member being in a ring shape and arranged on an inner cider of a sidewall of the chamber body; and
a cover member integrally formed with the body member, extending from a bottom of the body member along a radial direction of the body member, and configured to fix a to-be-processed workpiece placed over the base when a process is performed, wherein:
a cooling channel is arranged in the cover member and the body member and includes a first cooling channel in the body member and a second cooling channel in the cover member, the first cooling channel communicating with the second cooling channel;
a deposition ring, wherein the cover member and the deposition ring cooperate with each other to form a labyrinth channel,
the deposition ring including:
a deposition member arranged radially with a bottom surface on top of the base and configured to contact with and support an outer edge of the to-be-processed workpiece;
a deposition-ring convex member arranged axially, and
a deposition-ring concave groove between the deposition-ring convex member and the deposition member;
wherein
the cover member includes a cover-member concave member in a ring shape corresponding to, and cooperating with, the deposition-ring convex member, and
the cover member further includes a cover-member convex member with an inner ring sidewall inserted into the deposition-ring concave groove to form the labyrinth channel.

6. The sputtering reaction chamber according to claim 5, wherein:
the deposition ring is arranged along an outer edge of the base; and
the deposition ring cooperates with the cover member to form the labyrinth channel when the process is performed.

7. The sputtering reaction chamber according to claim 5, wherein:
the first channel is in a ring shape and is circumferentially arranged along a circumferential direction of the body member; and
the second channel extends from a bottom of the first channel to an end of the cover member along the radial direction of the cover member.

8. The sputtering reaction chamber according to claim 5, further comprising:
a channel connector located at a top of the body member;
wherein the cooling channel further includes:
a third channel connected to the channel connector and communicating with the first channel to circulate in real-time to change a coolant during cooling.

9. The sputtering reaction chamber according to claim 8, further comprising:
an adapter including a through-hole corresponding to the channel connector, the liner being mounted at the adapter.

* * * * *